US008581326B2

(12) United States Patent
Oota et al.

(10) Patent No.: US 8,581,326 B2
(45) Date of Patent: Nov. 12, 2013

(54) NONVOLATILE SEMICONDUCTOR MEMORY DEVICE AND MANUFACTURING METHOD THEREOF

(75) Inventors: Shigeto Oota, Yokohama (JP); Yoshimasa Mikajiri, Yokohama (JP); Ryouhei Kirisawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 861 days.

(21) Appl. No.: 12/727,644

(22) Filed: Mar. 19, 2010

(65) Prior Publication Data
US 2010/0301405 A1    Dec. 2, 2010

(51) Int. Cl.
*H01L 29/788*    (2006.01)
*H01L 21/336*    (2006.01)

(52) U.S. Cl.
USPC .......................................... 257/324; 257/326

(58) Field of Classification Search
USPC .................. 257/315–326, E29.3, E21.422
See application file for complete search history.

(56) References Cited

U.S. PATENT DOCUMENTS

| 8,217,446 B2* | 7/2012 | Fukuzumi et al. | 257/324 |
|---|---|---|---|
| 8,247,863 B2* | 8/2012 | Fukuzumi et al. | 257/324 |
| 8,283,228 B2* | 10/2012 | Alsmeier | 438/257 |
| 8,299,521 B2* | 10/2012 | Lee et al. | 257/326 |
| 8,426,276 B2* | 4/2013 | Kito et al. | 257/315 |
| 8,441,059 B2* | 5/2013 | Sim et al. | 257/324 |

FOREIGN PATENT DOCUMENTS

| JP | 2002-176154 | 6/2002 |
|---|---|---|
| JP | 2007-145661 | 6/2007 |
| JP | 2007-317874 | 12/2007 |
| JP | 2008-263029 | 10/2008 |
| JP | 2009-94236 | 4/2009 |

OTHER PUBLICATIONS

U.S. Appl. No. 12/725,827, filed Mar. 17, 2010, Kirisawa, et al.
Office Action maild Jul. 2, 2013 in Japanese Application No. 2009-129265 filed May 28, 2009 (w/English translation).

* cited by examiner

*Primary Examiner* — Cuong Q Nguyen
(74) *Attorney, Agent, or Firm* — Oblon, Spivak, McClelland, Maier & Neustadt, L.L.P.

(57) ABSTRACT

A nonvolatile semiconductor memory device including first laminated bodies each having a plurality of first gate electrodes of first memory cells, second laminated bodies each having a plurality of second gate electrodes of second memory cells, gate insulating film portions located on side surfaces of the first and second laminated bodies, first semiconductor layers that are each located between the first and second laminated bodies, first select transistors connected to an uppermost one of the first memory cells, second select transistors connected to an uppermost one of the second memory cells, isolation insulating films to separate the first and second select transistors into portions on the first and second laminated body sides, and a substrate potential applying electrode located to penetrate the isolation insulating films from a front surface side to a back surface side and connected to the first semiconductor layers.

14 Claims, 18 Drawing Sheets

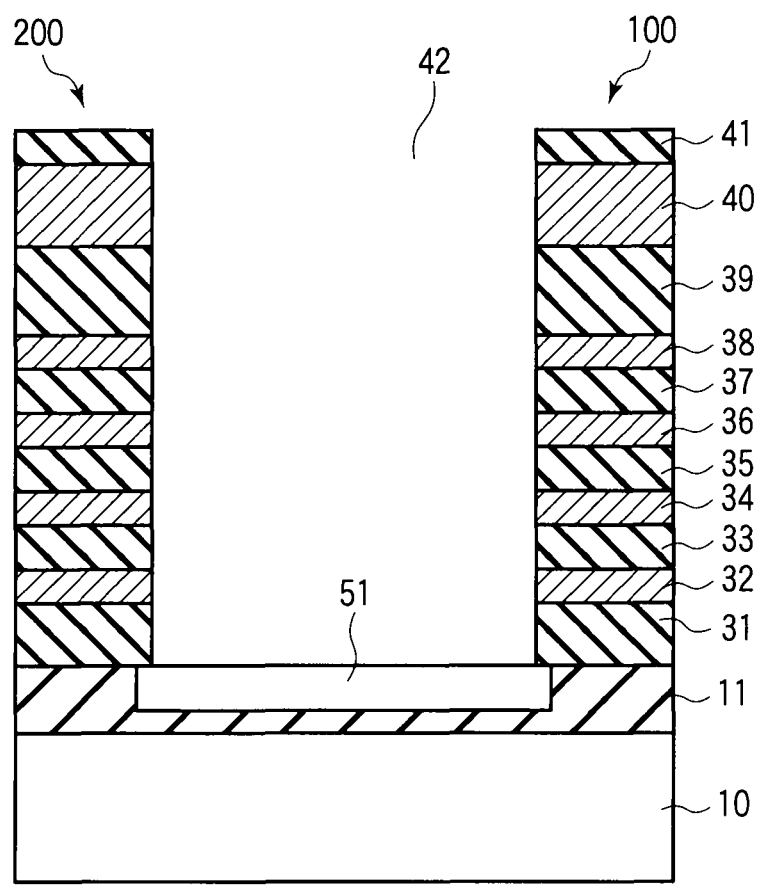
F I G. 16

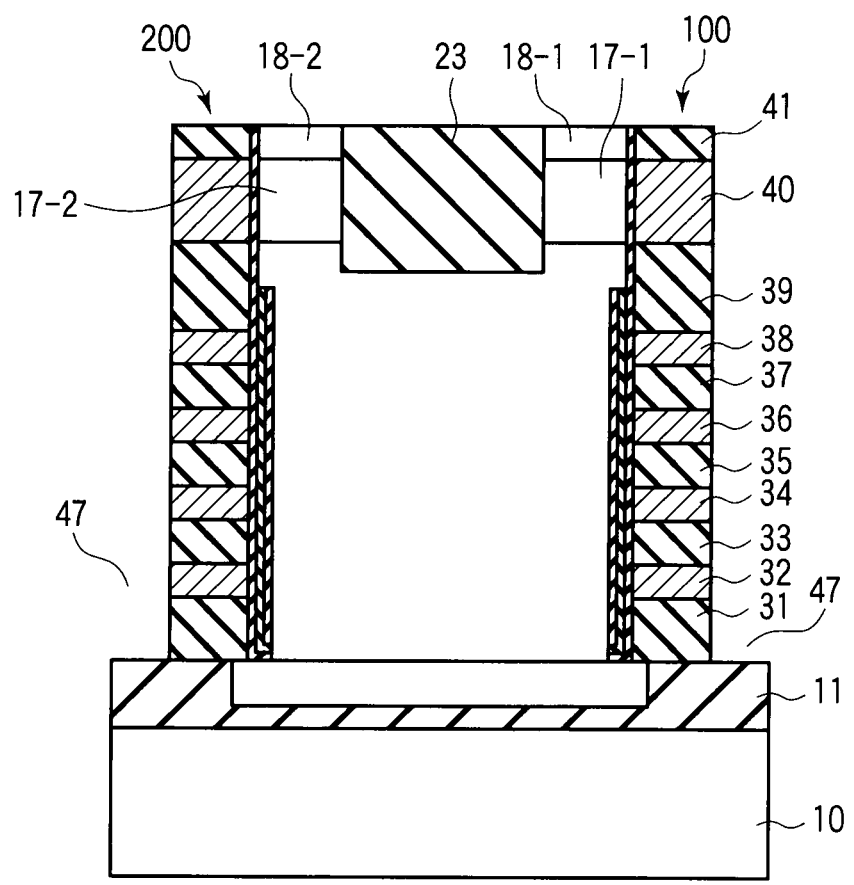
F I G. 21

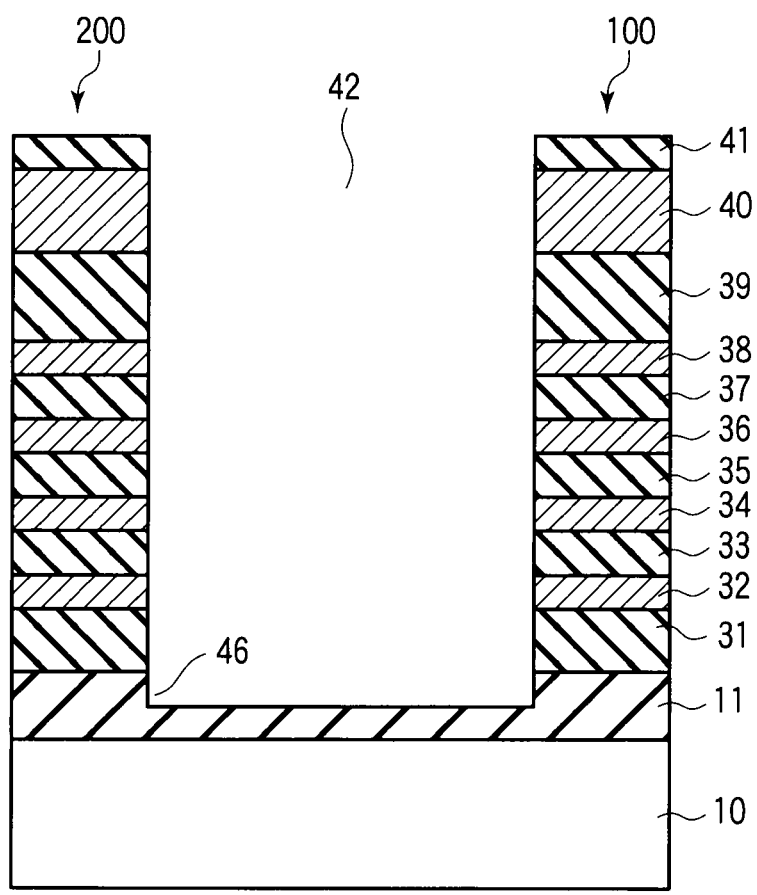
F I G. 23

NONVOLATILE SEMICONDUCTOR MEMORY DEVICE AND MANUFACTURING METHOD THEREOF

CROSS-REFERENCE TO RELATED APPLICATIONS

This application is based upon and claims the benefit of priority from prior Japanese Patent Application No. 2009-129265, filed May 28, 2009, the entire contents of which are incorporated herein by reference.

BACKGROUND OF THE INVENTION

1. Field of the Invention

This invention relates to a nonvolatile semiconductor memory device having memory cells stacked vertically and more particularly to a nonvolatile semiconductor memory device in which the structure for applying substrate potential is improved and a manufacturing method thereof.

2. Description of the Related Art

Conventionally, as one of electrically erasable programmable read-only memories (EEPROMs), a NAND flash memory that can be integrated with high integration density is widely used. In order to further increase the capacity of the NAND flash memory, it is required to further miniaturize the device or perform a multivalue storage operation. However, the degree of miniaturization depending on the manufacturing device has a limitation and enhancement of the recording density by multivalue storage has a limitation from the viewpoint of data integrity.

Therefore, recently, a stacked nonvolatile semiconductor memory device having memory cells stacked vertically by arranging gate electrodes of NAND cell units separately in a vertical direction on side surfaces of a column-shaped semiconductor layer is proposed (for example, Jpn. Pat. Appln. KOKAI Publication No. 2007-145661). In this device, first and second laminated bodies each configured by laminating a plurality of gate electrodes with insulating layers disposed therebetween are separately arranged on the substrate. A semiconductor layer that functions as active regions of the memory cells is filled between the laminated bodies. Further, a NAND cell unit is configured by serially connecting the memory cells formed on the first laminated body side and the memory cells formed on the second laminated body side. Then, an isolation insulating film used to isolate the right and left laminated bodies from each other is formed on the upper portion of the semiconductor layer.

However, since the column-shaped semiconductor layer is made to float in this type of nonvolatile semiconductor memory device, it is impossible to directly apply substrate potential to the semiconductor layer. For this reason, a variation occurs in voltages applied at the write and erase operation times. As a result, there occurs a problem that stable write and erase operations cannot be performed.

BRIEF SUMMARY OF THE INVENTION

According to one aspect of this invention, there is provided a nonvolatile semiconductor memory device comprising first laminated bodies each having a plurality of first gate electrodes laminated with insulating films disposed therebetween to form a plurality of first memory cells on a substrate, second laminated bodies located separately from the first laminated bodies on the substrate and each having a plurality of second gate electrodes laminated with insulating films disposed therebetween to form a plurality of second memory cells, gate insulating film portions located on side surfaces of the first laminated bodies and the second laminated bodies and each containing a charge storage layer, first semiconductor layers that are each located between the first laminated bodies and the second laminated bodies on which the gate insulating film portion is formed and act as active regions of the first memory cells and the second memory cells, first select transistors located above the first semiconductor layers and each serially connected to an uppermost one of the first memory cells, second select transistors located above the first semiconductor layers and each serially connected to an uppermost one of the second memory cells, isolation insulating films located on the first semiconductor layers to separate the first select transistors and the second select transistors into portions on the first laminated body sides and the second laminated body sides, and a substrate potential applying electrode located to penetrate the isolation insulating films from a front surface side to a back surface side and connected to the first semiconductor layers.

According to another aspect of this invention, there is provided a nonvolatile semiconductor memory device comprising first laminated bodies each having a plurality of first gate electrodes laminated with insulating films disposed therebetween to form a plurality of first memory cells on a substrate and having a gate electrode of a first select transistor laminated above an uppermost one of the first gate electrodes with an insulating film disposed therebetween, second laminated bodies located separately from the first laminated bodies on the substrate and each having a plurality of second gate electrodes laminated with insulating films disposed therebetween to form a plurality of second memory cells and having a gate electrode of a second select transistor laminated above an uppermost one of the second gate electrodes with an insulating film disposed therebetween, gate insulating film portions located on side surfaces of the first laminated bodies and the second laminated bodies and each containing a charge storage layer, first semiconductor layers of a first conductivity type that are each located between the first laminated bodies and the second laminated bodies to a portion lying on bottom portions of the gate electrodes of the respective select transistors in a laminated direction and act as active regions of the first memory cells and the second memory cells, the first semiconductor layers being in contact with the gate insulating film portions, second semiconductor layers of a second conductivity type located on the first semiconductor layers to portions that lie on top portions of the gate electrodes of the respective select transistors in a laminated direction, third semiconductor layers of the first conductivity type located on the second semiconductor layers, isolation insulating films located in the second and third semiconductor layers to separate the second and third semiconductor layers into portions on the first laminated body sides and the second laminated body sides, and a substrate potential applying electrode located to penetrate the isolation insulating films from a front surface side to a back surface side thereof and connected to the first semiconductor layers.

According to still another aspect of this invention, there is provided a manufacturing method of a nonvolatile semiconductor memory device comprising forming a laminated body by laminating a plurality of gate electrodes used to configure a plurality of memory cells with insulating films disposed therebetween on a substrate and laminating a gate electrode of a select transistor on an uppermost one of the gate electrodes with an insulating layer disposed therebetween, forming a groove in a central portion of the laminated body to separate the laminated body into first laminated bodies and second laminated bodies, forming a gate insulating film portion containing a charge storage layer on side surfaces of the groove, filling and forming a first semiconductor layer acting as active regions of the memory cells in the groove in which the gate insulating film portion is formed, forming a second semiconductor layer acting as a channel of the select transistor and extending from a surface of the first semiconductor layer to a portion lying on a bottom portion of the gate electrode of each select transistor, forming a third semiconductor layer acting as one of source and drain regions of the select transistor and extending from a surface of the second semiconductor layer to a portion lying on a top portion of the gate electrode of each select transistor, filling and forming an isolation insulating film in the second and the third semiconductor layers to separate the second and third semiconductor layers into portions on the first laminated bodies and the second laminated body sides, and forming a substrate potential applying electrode that penetrates the isolation insulating film from a front surface side to a back surface side thereof and is connected to the first semiconductor layer.

BRIEF DESCRIPTION OF THE SEVERAL VIEWS OF THE DRAWING

FIG. 16 is a cross-sectional view showing a manufacturing step of the NAND flash memory of the second embodiment.

FIG. 21 is a cross-sectional view showing a manufacturing step of the NAND flash memory of the second embodiment.

FIG. 23 is a cross-sectional view showing a manufacturing step of a NAND flash memory according to a third embodiment of this invention.

DETAILED DESCRIPTION OF THE INVENTION

Embodiments of this invention will be explained in detail below with reference to the accompanying drawings.

(First Embodiment)

Figure 1:
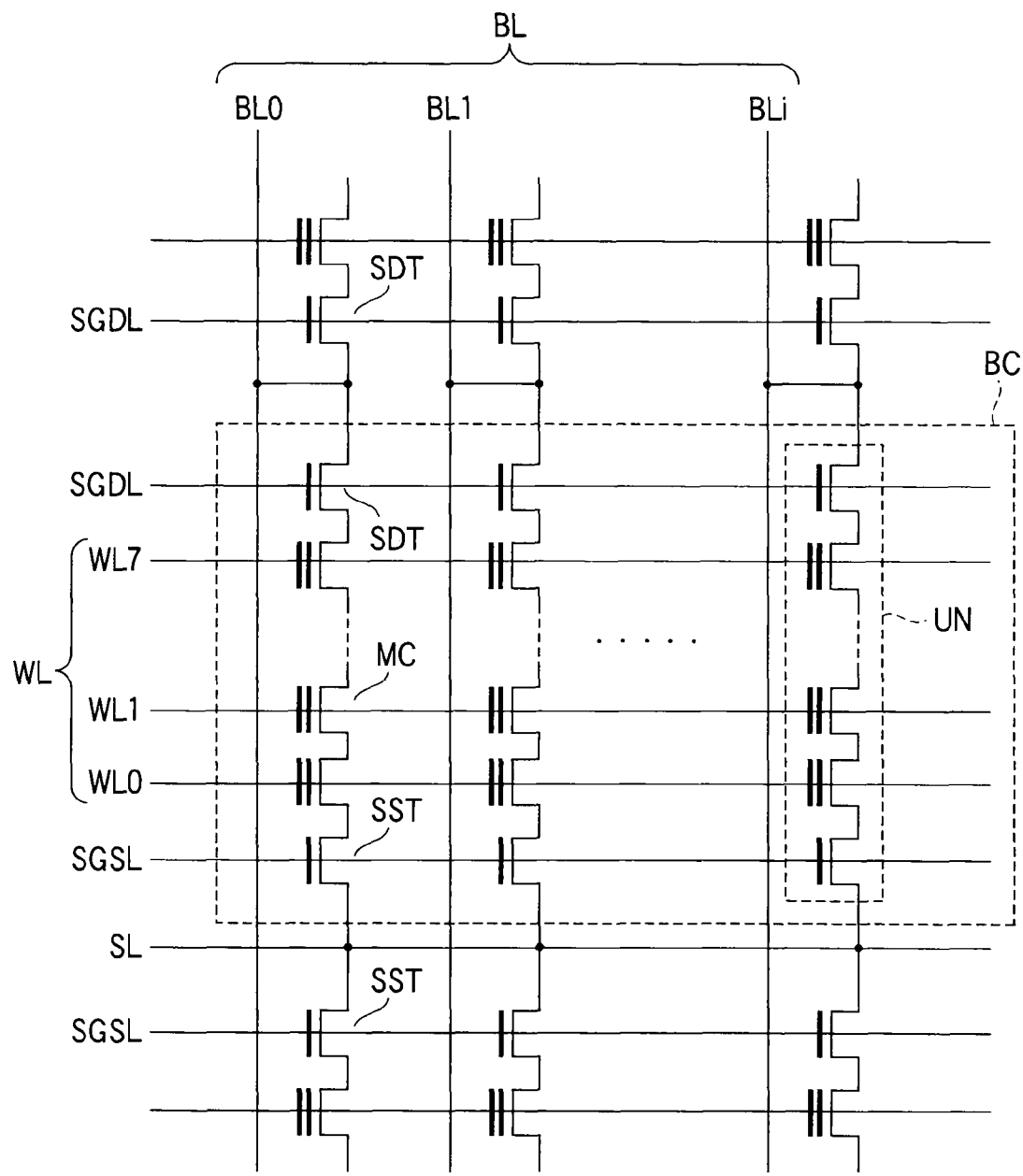
FIG. 1 is a diagram showing the circuit configuration of a NAND flash memory according to a first embodiment of this invention.

FIG. 1 is a diagram showing the circuit configuration of a NAND flash memory according to a first embodiment of this invention.

One unit UN that is an erase unit comprises a plurality of memory cells MC, for example, eight memory cells MC that are serially connected, a first select transistor SST serially connected to one end (source side) thereof and a second select transistor SDT serially connected to the other end (drain side) thereof.

Word lines WL (WL1 to WL7) are connected to control terminals of the cell transistors of the respective memory cells MC. Select gate lines SGSL are each connected to the gate terminals of source-side select transistors SST. Further, source lines SL are each connected to the source terminals of select transistors SST. Select gate lines SGDL are each connected to the gate terminals of drain-side select transistors SDT. Further, bit lines BL (BL1 to BLi) are each connected to the drain terminals of the respective select transistors SDT.

Select gate lines SGSL and SGDL are provided to control turning on and off of select transistors SST and SDT. Select transistors SST and SDT function as gates that supply preset potentials to the memory cells in the unit UN when writing and reading.

A plurality of units UN are arranged in a row direction (an extending direction of the word lines WL) to configure a block BC. A plurality of memory cells that are connected to the same word line in one of the blocks BC are dealt with as one page and the write and read operations are performed for each page.

A plurality of blocks BC are arranged in a column direction (an extending direction of the bit lines BL). Further, the plural blocks BC are arranged in a sequentially folded pattern. That is, a desired block and a block that is adjacent to the desired block on one side are arranged with drain-side select transistors SDT set to face each other. The desired block and a block that is adjacent to the desired block on the other side are arranged with source-side select transistors SST set to face each other.

Figure 2A:
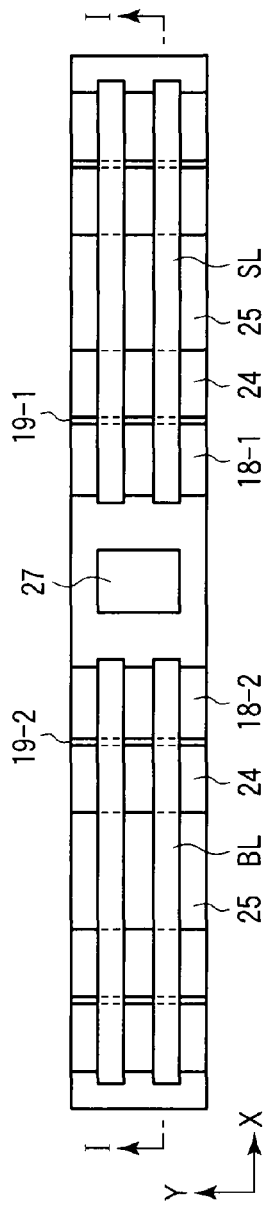
FIGS. 2A and 2B are plan and cross-sectional views showing the device structures of the NAND flash memory according to the first embodiment.

Next, the structure of the NAND flash memory shown in FIG. 1 is explained. FIG. 2A is a plan view showing the device structure of the NAND flash memory according to the first embodiment of this invention and FIG. 2B is a cross-sectional view taken along line I-I of FIG. 2A.

The NAND flash memory of this embodiment is a NAND flash memory with an SOI (Silicon On Insulator) structure. Further, as the memory cells and select transistors in this embodiment, vertical cell transistors and vertical select transistors are used. The vertical transistor is a transistor having a channel formed vertically.

A plurality of vertical cell transistors are stacked in an upper direction (vertical direction) and a vertical select transistor SST is arranged on the uppermost portion. The thus configured structure is used as a first laminated body 100. A second laminated body 200 that is configured by a plurality of vertical cell transistors and a vertical select transistor SDT arranged on the uppermost portion thereof is arranged separately from the first laminated body 100. Further, the lowermost one of the cell transistors of the first laminated body 100 and the lowermost one of the cell transistors of the second laminated body 200 are serially connected. The structure thereof is explained in detail below.

Figure 2B:
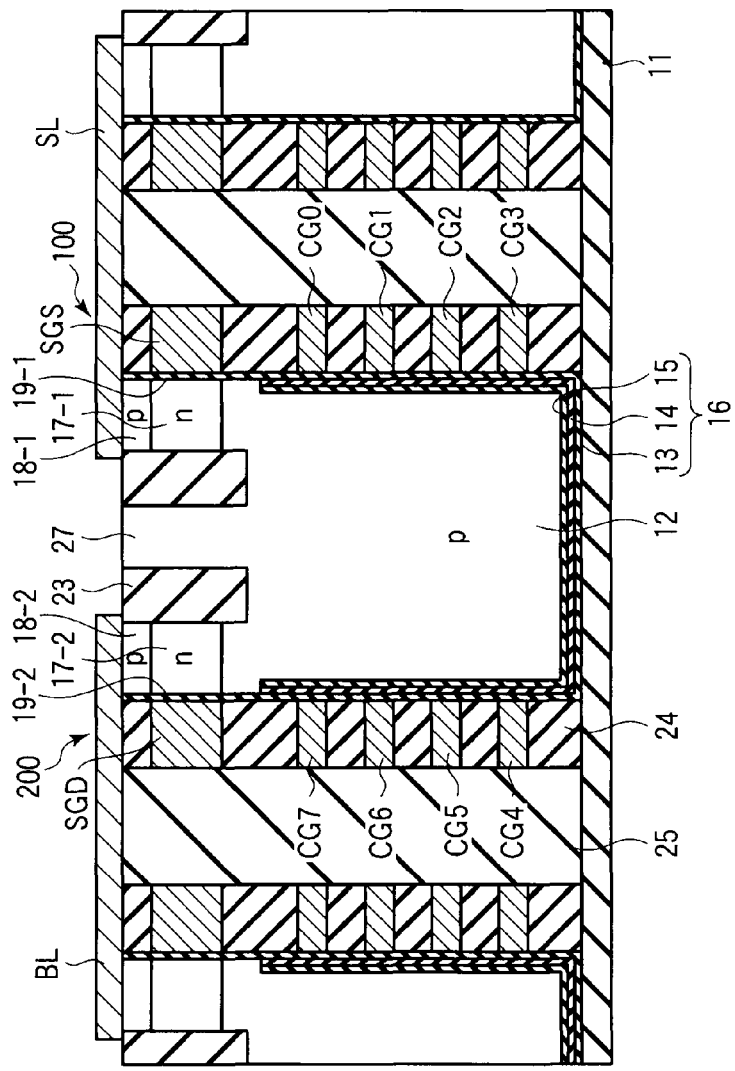

As shown in FIGS. 2A and 2B, a pillar-form p$^-$-type semiconductor layer (first semiconductor layer) 12 is formed above an insulating layer 11 used as a supporting layer. A gate insulating film portion 16 is formed on the side and bottom surfaces of semiconductor layer 12.

The gate insulating film portion 16 has a laminated structure comprising charge storage means for capturing and storing charges. The gate insulating film portion 16 with the laminated structure sequentially includes a first gate insulating film 13, charge storage layer 14 and second gate insulating film 15 in an order from the opposite side of semiconductor layer 12.

The first gate insulating film 13 is arranged between the charge storage layer 14 and a gate electrode that will be described later to prevent charges stored on the charge storage layer 14 from being diffused into gate electrode. As the first gate insulating film 13, for example, a silicon oxide film is used. The film thickness of the first gate insulating film 13 is approximately 4 nm.

The charge storage layer 14 is mainly used as charge storage means and captures and stores charges (electrons). As the charge storage layer 14, for example, a silicon nitride film is used. The film thickness of the charge storage layer 14 is approximately 8 nm.

The second gate insulating film 15 acts as a potential barrier when charges are stored on the charge storage layer 14 from semiconductor layer 12 or when charges stored on the charge storage layer 14 are diffused into semiconductor layer 12. As the second gate insulating film 15, for example, a silicon oxide film is used. The silicon oxide film is excellent in the insulating property in comparison with the silicon nitride film and has a preferable function of preventing diffusion of charges. The film thickness of the second gate insulating film 15 is approximately 4 nm.

Thus, as the gate insulating film portion 16, for example, an ONO film (a laminated film of an oxide film, nitride film and oxide film) is used.

On the upper right portion of semiconductor layer 12, an n$^-$-type semiconductor layer (second semiconductor layer) 17-1 acting as a channel region of select transistor SST is provided. Semiconductor layer 17-1 is a semiconductor layer having low-concentration n$^-$-type impurities doped therein. On semiconductor layer 17-1, a p$^+$-type semiconductor layer (third semiconductor layer) 18-1 acting as the source region of select transistor SST is formed. Semiconductor layer 18-1 is a semiconductor layer having high-concentration p$^+$-type impurities diffused therein. On the side surface of semiconductor layer 17-1, a gate insulating film 19-1 for the select transistor is provided.

Likewise, on the upper left portion of semiconductor layer 12, an n$^-$-type semiconductor layer (second semiconductor layer) 17-2 acting as a channel region of select transistor SDT is provided. On semiconductor layer 17-2, a p$^+$-type semiconductor layer (third semiconductor layer) 18-2 acting as the drain region of select transistor SDT is formed. On the side surface of semiconductor layer 17-2, a gate insulating film 19-2 for the select transistor is provided.

On the insulating film 11, control gate electrodes CG3, CG2, CG1 and CG0 of the memory cells MC and gate electrode SGS of select transistor SST are laminated with interlayer insulating films 24 disposed therebetween. Further, gate electrodes CG3, CG2, CG1 and CG0 are formed above the side surface of semiconductor layer 12 with the gate insulating film portion 16 disposed therebetween. Gate electrode SGS is formed above the side surface of semiconductor layer 17-1 with gate insulating film 19-1 disposed therebetween.

Likewise, on the insulating film 11, gate electrodes CG4, CG5, CG6 and CG7 of the memory cells MC and gate electrode SGD of select transistor SDT are laminated with interlayer insulating films 24 disposed therebetween. Further, gate electrodes CG4, CG5, CG6 and CG7 are formed above the side surface of semiconductor layer 12 with the gate insulating film portion 16 disposed therebetween. Gate electrode SGD is formed above the side surface of semiconductor layer 17-2 with gate insulating film 19-2 disposed therebetween.

Gate electrodes CG0 to CG7 correspond to the word lines WL0 to WL7 shown in FIG. 1. Gate electrode SGS corresponds to select gate line SGSL shown in FIG. 1. Gate electrode SGD corresponds to select gate line SGDL shown in FIG. 1.

The film thickness (gate length) of gate electrodes SGS and SGD of the select transistors is set large in comparison with the film thickness (gate length) of gate electrode CG of the memory cell MC. This is because the cutoff characteristic of the select transistor is made preferable. For example, the film thickness (gate length) of gate electrode CG is set to approximately 30 nm. Further, the film thickness (gate length) of gate electrodes SGS and SGD is set to approximately 150 nm. The distance between gate electrodes CG is set to the same length as the gate length, for example.

As the gate electrode, for example, polysilicon is used. By forming a part of the polysilicon film into a silicide form, the gate electrode can be formed to contain a silicide layer. By thus forming the gate electrode, the resistance of the gate electrode can be lowered. Further, in order to reduce the resistance of the gate electrode, a metal such as tungsten (W), aluminum (Al), copper (Cu) or the like may be used. When a metal is used as the gate electrode, a silicide layer becomes unnecessary.

On semiconductor layer 18-1, a source line SL is formed. On semiconductor layer 18-2, a bit line BL is formed. The source line SL is also connected to the source region of a corresponding select transistor SST in an adjacent block in the X direction. Further, the bit line BL is also connected to the source region of a corresponding select transistor SDT in an adjacent block in the X direction. For example, contacts are formed on the source line SL and bit line BL and preset potentials are applied thereto via the contacts.

Thus, a NAND cell unit having select transistor SST, plural memory cells MC and select transistor SDT serially connected in this order between the source line SL and the bit line BL is formed.

As described before, the memory cell MC in this embodiment is a metal oxide nitride oxide semiconductor (MONOS) memory cell having the charge storage layer 14 of a silicon nitride film formed in the gate insulating film portion 16. In the memory cell MC, since the whole portion of the gate insulating film portion 16 containing the charge storage layer 14 is an insulating body, a process for isolating the floating gate electrode for each cell is unnecessary unlike a floating gate memory cell. That is, the gate insulating film portion 16 may be formed on the whole portion of the side surface of semiconductor layer 12 and a patterning process is not required. Therefore, the structure obtained by stacking vertical memory cells in a vertical direction can be easily realized.

The MONOS memory cell MC captures and stores charges (electrons) on the charge storage layer 14. The ability of capturing charges can be expressed by charge trap density and a larger amount of charges can be captured as the charge trap density becomes higher.

Electrons are injected from the channel region into the charge storage layer 14. Electrons injected into the charge storage layer 14 are captured in traps of the charge storage layer 14. Electrons captured by the traps cannot be easily removed from the traps and stably remain therein. The threshold voltage of the memory cell MC varies according to the charge amount of the charge storage layer 14. Since binary 0 or binary 1 can be determined according to the level of the threshold voltage, binary data can be stored in the memory cell MC.

Each of select transistors SST and SDT of this embodiment is an enhancement metal insulator semiconductor (MIS) transistor. The memory cell MC of this embodiment is a depletion MIS transistor. In p$^-$-type semiconductor layer 12 acting as the channel region (active region) of the memory cell MC, source and drain diffusion layers with a conductivity type different from that of semiconductor layer 12 are not formed. That is, p$^-$-type semiconductor layer 12 functions as a channel region, source region and drain region of a cell transistor. The memory cell MC is turned off by substantially entirely forming a depletion layer in p$^-$-type semiconductor layer 12 directly under gate electrode CG according to the potential applied to gate electrode CG.

Next, the write, read and erase operations of the NAND flash memory with the above configuration are explained.

During a write, negative write potential Vpgm is applied to a word line WL of a selected memory cell MC and negative intermediate potential Vpass (<Vpgm) is applied to word lines WL of non-selected memory cells MC. Further, VCC (power supply potential) is applied to select gate line SGDL on the drain side to turn on select transistor SDT. Also, 0 V (ground potential) is applied to select gate line SGSL on the source side to cut off select transistor SST. Then, 0 V or VCC (for example, −3 V) is applied to the selected bit line BL according to to-be-written data.

By the above operation, select transistor SDT and the non-selected memory cells MC in the unit are made to conduct. The bit line potential is transmitted to the channel region of the selected memory cell MC to shift the threshold voltage of the memory cell MC.

For example, when binary 0 is written, 0 V is applied to the bit line BL. Then, since a strong electric field is generated between gate electrode CG and the channel region of the memory cell MC, charges are injected into the charge storage layer 14. As a result, the threshold voltage is shifted in a negative direction.

The binary 1 write operation is to maintain the state without changing the threshold voltage of the memory cell MC (maintain the erase state). In this state, charges are not injected into the charge storage layer 14 even if negative high potential Vpgm is applied to gate electrode CG of the memory cell MC. For this purpose, VCC is applied to the bit line BL. Then, Vpgm is applied to the selected word line WL and Vpass is applied to the non-selected word line WL after VCC is charged to the channel region of the memory cell MC at the initial time of the write operation.

Then, channel potential is raised because of the capacitive coupling between gate electrode CG and the channel region, but select transistor SDT is cut off since the potential of select gate line SGDL on the drain side is set to VCC together with the bit line BL. That is, the channel region of the selected memory cell MC is made to float. As a result, charges are not injected into the memory cell MC and the threshold voltage is kept unchanged.

During a read, for example, 0 V is applied to the word line WL of the selected memory cell MC and VCC or read potential Vread that is slightly higher than VCC is applied to select gate lines SGDL and SGSL and the word lines WL of the non-selected memory cells MC. At this time, select transistors SDT and SST and non-selected memory cells MC are made to conduct. Therefore, the potential of the bit line BL is determined according to whether the threshold voltage of the selected memory cell MC is positive or negative and data can be read by detecting the potential.

The erase operation is performed for each block unit. During an erase, select gate lines SGDL and SGSL and bit lines BL are made to float, 0 V is applied to all of the word lines WL of a selected block and negative erase potential Vera is applied to the source line SL. Therefore, charges held by the charge storage layers 14 in the selected block are discharged into the channel regions. As a result, the threshold voltages of the memory cells MC are shifted in a positive direction.

All of the word lines WL, select gate lines SGDL and SGSL and bit lines BL in the non-selected blocks are made to float. As a result, in the non-selected block, the potentials of the word lines WL are raised to a value near Vera because of the capacitive coupling with the channel regions, and therefore, the erase operation is not performed.

Next, one example of the manufacturing method of the NAND flash memory of this embodiment is explained with reference to FIGS. 3 to 12.

Figure 3:
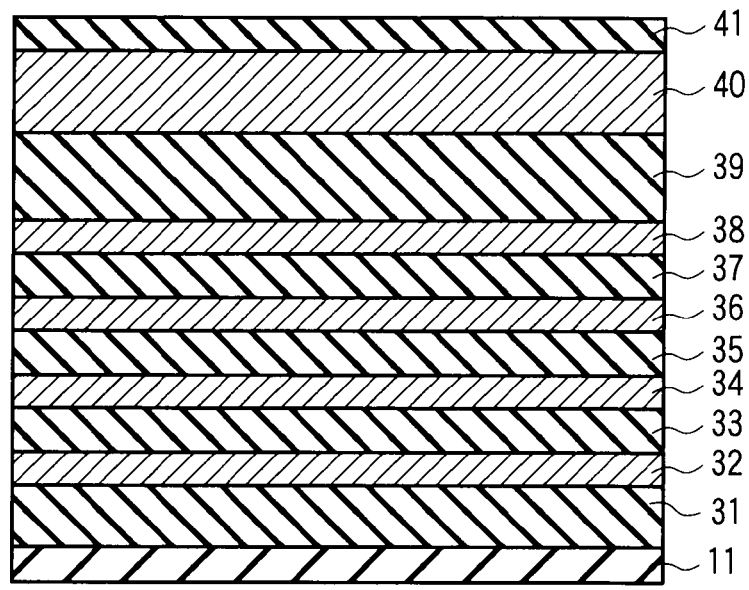
FIG. 3 is a cross-sectional view showing a manufacturing step of the NAND flash memory of the first embodiment.

First, as shown in the cross-sectional view of FIG. 3, an insulating layer 11 used as a supporting substrate is prepared. As the insulating film 11, for example, a layer obtained by forming a silicon oxide film on a silicon substrate is used. Then, a laminated body is formed on the insulating layer 11 by alternately laminating interlayer insulating films (31, 33, 35, 37, 39 and 41) and gate electrodes (32, 34, 36, 38 and 40).

Gate electrode 32 is formed into gate electrodes CG3 and CG4 in a later processing step. Gate electrode 34 is formed into gate electrodes CG2 and CG5 in a later processing step. Gate electrode 36 is formed into gate electrodes CG1 and CG6 in a later processing step. Gate electrode 38 is formed into gate electrodes CG0 and CG7 in a later processing step. Gate electrode 40 is formed into gate electrodes SGS and SGD in a later processing step. Further, interlayer insulating films 31, 33, 35, 37, 39 and 41 correspond to interlayer insulating film 24 shown in FIG. 2B.

In this embodiment, for example, polysilicon is used to from the gate electrode. Further, as described before, in order to reduce the resistance of the gate electrode, tungsten (W), aluminum (Al), copper (Cu) or the like may be used. As the interlayer insulating film, a silicon oxide film may be used, for example. Alternatively, a phosphorus silicate glass (PSG) film, boron silicate glass (BSG) film or boron phosphorus silicate glass (BPSG) film having boron (B) and phosphorus (P) contained in a silicon oxide film may be used.

Figure 4:
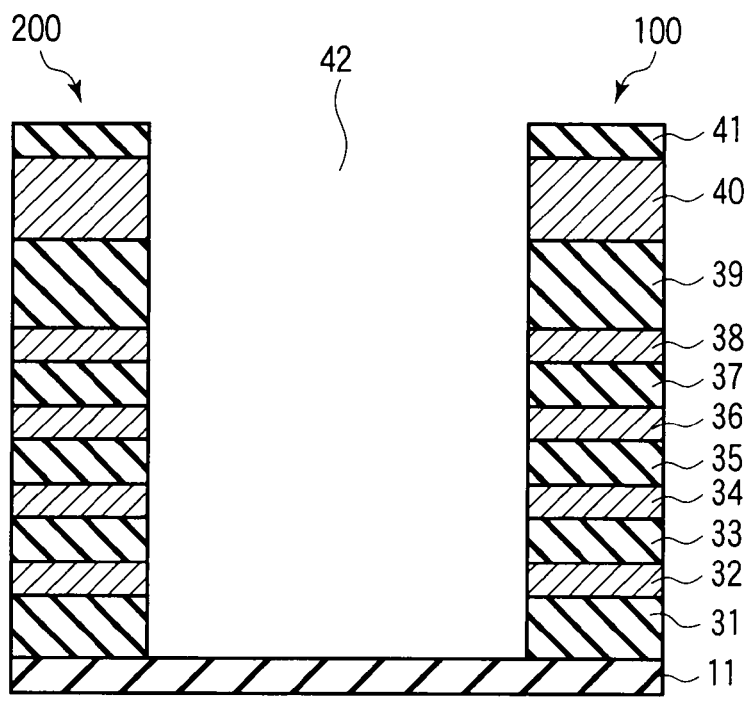
FIG. 4 is a cross-sectional view showing a manufacturing step of the NAND flash memory of the first embodiment.

Next, as shown in the cross-sectional view of FIG. 4, an opening portion 42 is formed in the laminated film to expose the upper surface of the insulating layer 11 by selectively etching the interlayer insulating films (31, 33, 35, 37, 39 and 41) and gate electrodes (32, 34, 36, 38 and 40) by using the lithography method and the reactive ion etching (RIE)

method. Thus, the laminated boy is divided into a first laminated body 100 on the right side and a second laminated body 200 on the left side.

Figure 5:
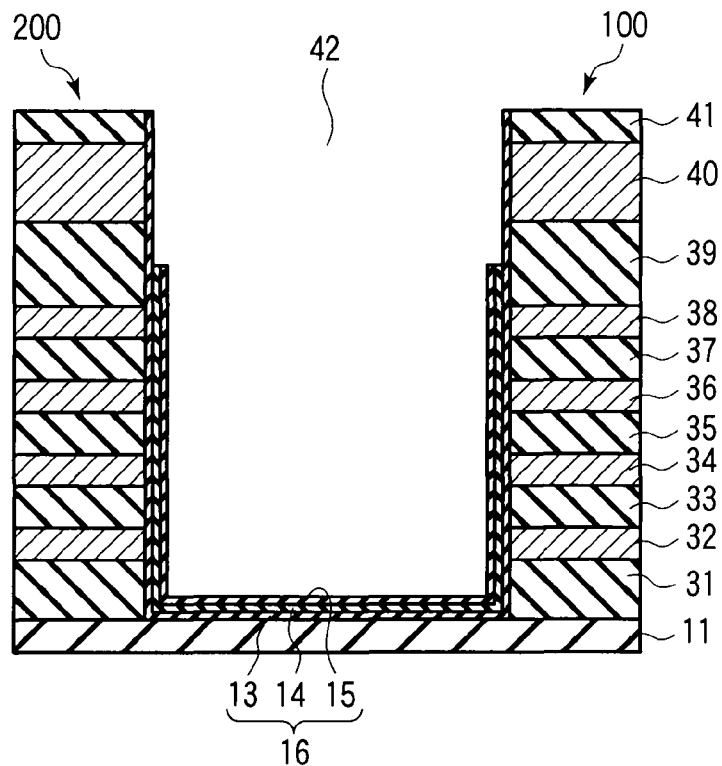
FIG. 5 is a cross-sectional view showing a manufacturing step of the NAND flash memory of the first embodiment.

Next, as shown in the cross-sectional view of FIG. 5, a gate insulating film portion 16 comprising a first gate insulating film 13, charge storage layer 14 and second gate insulating film 15 is formed on the side surfaces of the laminated bodies 100 and 200 exposed to opening portion 42 and on the bottom surface of opening portion 42. In this case, the first gate insulating film 13 is formed on the entire portion of opening portion 42 and the charge storage layer 14 and second gate insulating film 15 are formed to an intermediate portion of interlayer insulating film 39. A part of the first gate insulating film 13 is used as gate insulating film 19 of the select transistor.

The forming method may be performed by forming three layers of the first gate insulating film 13, charge storage layer 14 and second gate insulating film 15, then filling a mask member in opening portion 42 to an intermediate portion of interlayer insulating film 39 and removing exposed portions of the second gate insulating film 15 and charge storage layer 14.

Figure 25:
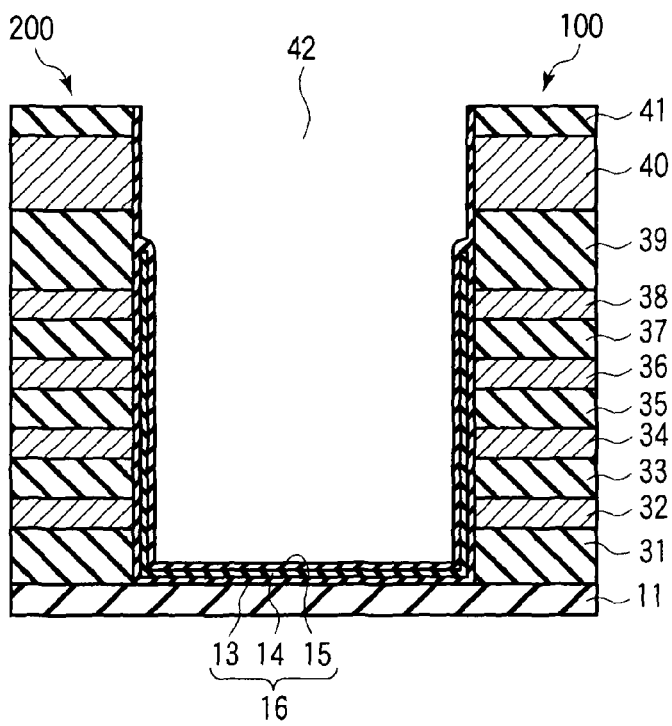
FIG. 25 is a cross-sectional view showing a modification of the NAND flash memory of the first embodiment.

Further, as another method, a method disclosed in Jpn. Pat. Appln. KOKAI Publication No. 2007-145661 may be used. That is, after the first gate insulating film 13 and charge storage layer 14 are sequentially deposited on the bottom surface and side surfaces of opening portion 42, a mask member is filled in opening portion 42 to an intermediate portion of interlayer insulating film 39. Next, portions of the first gate insulating film 13 and charge storage layer 14 that are formed above the upper surface of the mask member are etched. Then, the second gate insulating film 15 is formed on the charge storage layer 14 and the sidewall surfaces of opening portion 42 after removing the mask member. In this case, the gate insulating film portion 16 has the structure as shown in FIG. 25 and a part of the second gate insulating film 15 is used as gate insulating film 19 of the select transistor.

Figure 6:
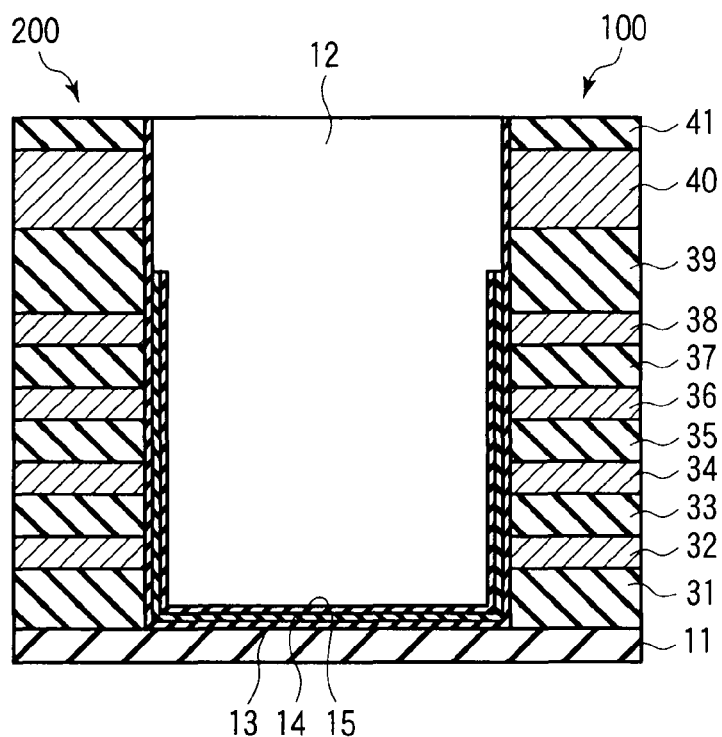
FIG. 6 is a cross-sectional view showing a manufacturing step of the NAND flash memory of the first embodiment.

Next, as shown in the cross-sectional view of FIG. 6, a p$^-$-type semiconductor layer 12 is filled and formed in opening portion 42. As semiconductor layer 12, a silicon layer having boron (B) that is a p-type impurity doped therein is used.

Figure 7:
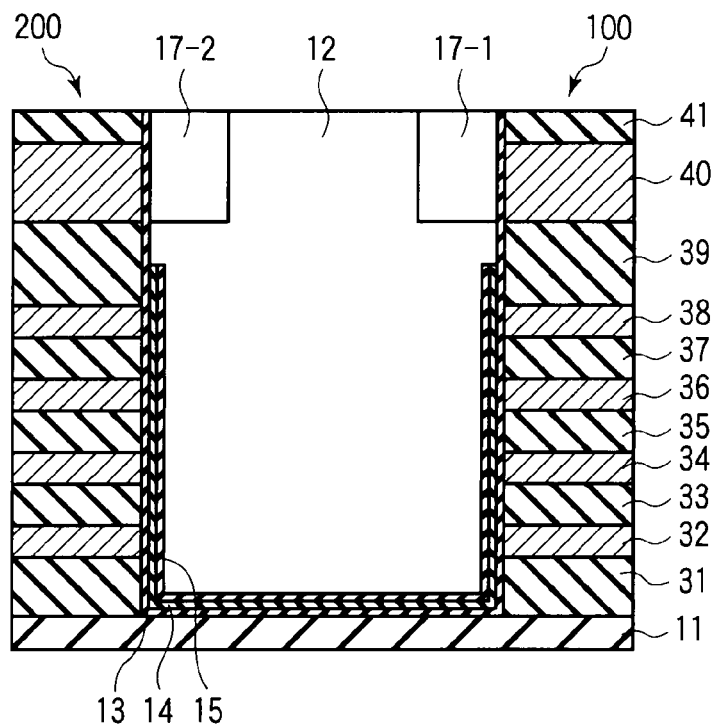
FIG. 7 is a cross-sectional view showing a manufacturing step of the NAND flash memory of the first embodiment.

Then, as shown in the cross-sectional view of FIG. 7, phosphorus or arsenic of low-concentration n$^-$-type impurity is doped into semiconductor layer 12. Thus, n$^-$-type semiconductor layers 17-1 and 17-2 used as the channel regions of select transistors SST and SDT are formed. Since an insulating layer 24 is formed between semiconductor layers 17-1 and 17-2 in a later step, it is not always necessary to separately dope n-type impurities into semiconductor layers 17-1 and 17-2.

Figure 8:
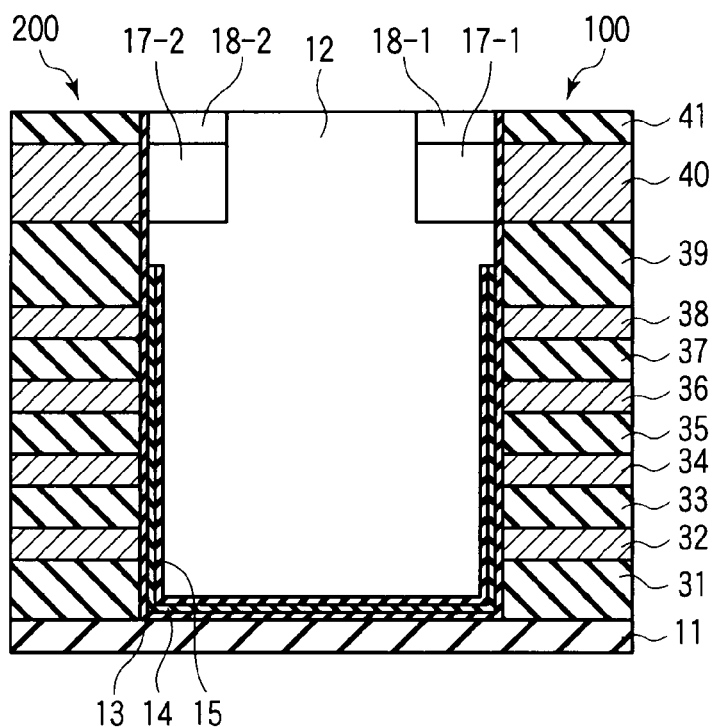
FIG. 8 is a cross-sectional view showing a manufacturing step of the NAND flash memory of the first embodiment.

Next, as shown in the cross-sectional view of FIG. 8, high-concentration p-type impurities are doped into semiconductor layers 17-1 and 17-2. As a result, a p$^+$-type semiconductor layer 18-1 used as the source region of select transistor SST is formed in semiconductor layer 17-1 and a p$^+$-type semiconductor layer 18-2 used as the drain region of select transistor SDT is formed in semiconductor layer 17-2.

Figure 9A:
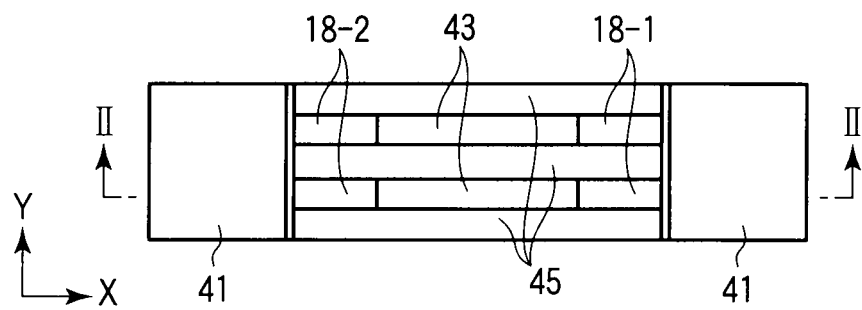
FIGS. 9A and 9B are plan and cross-sectional views showing a manufacturing step of the NAND flash memory of the first embodiment.
Figure 9B:
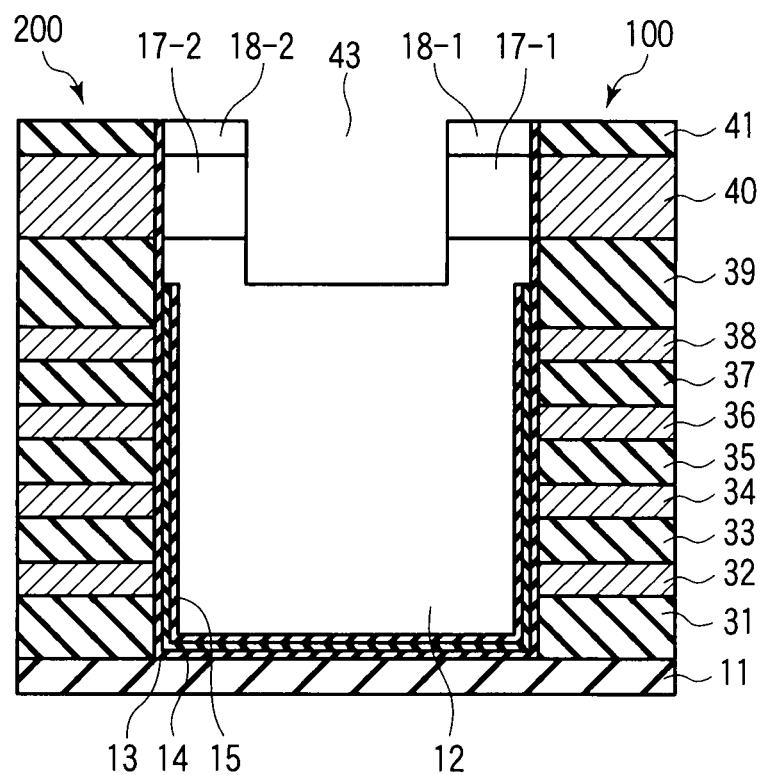

Then, as shown in the plan view of FIG. 9A and in the cross-sectional view of FIG. 9B taken along line II-II of FIG. 9A, opening portions 43 are formed to separate semiconductor layers 17-1 and 17-2 and semiconductor layers 18-1 and 18-2 into right and left portions by using the lithography method and RIE method. Subsequently, semiconductor layers 12, 17 and 18 are patterned to make a plate-like form in the X direction in order to separate them into a plurality of units.

As a result, opening portions 45 that reach the bottom portion of semiconductor layer 12 are formed between the units adjacent in the Y direction.

Figure 10:
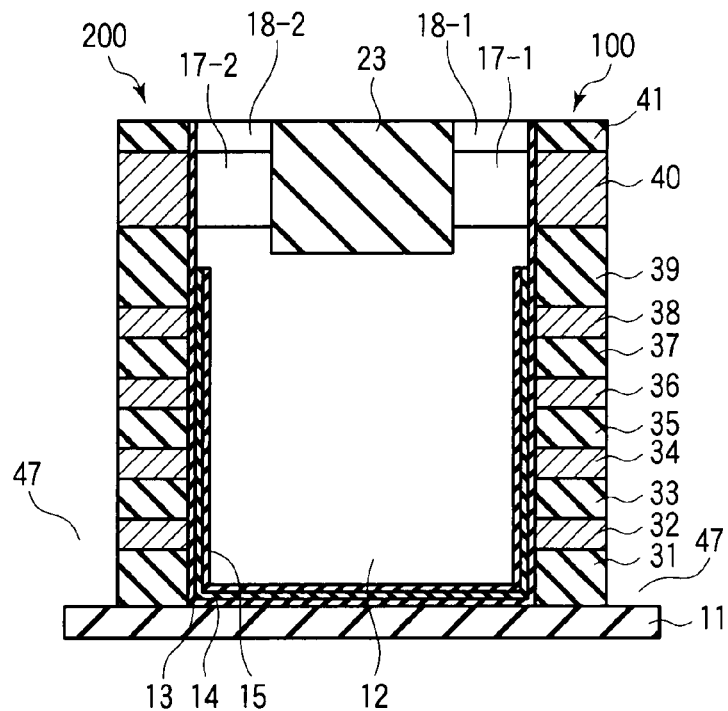
FIG. 10 is a cross-sectional view showing a manufacturing step of the NAND flash memory of the first embodiment.

Next, as shown in the cross-sectional view of FIG. 10, the units that are adjacent in the Y direction are electrically isolated and semiconductor layers 17-1 and 18-1 and semiconductor layers 17-2 and 18-2 are isolated by filling insulating layers 23 into opening portions 43 and 45. Then, interlayer insulating films 31, 33, 35, 37, 39 and 41, and gate electrodes 32, 34, 36, 38 and 40 are patterned in order to electrically isolate the gate electrodes of the blocks adjacent in the X direction. As a result, opening portions 47 are formed to expose the side surfaces of gate electrodes 32, 34, 36, 38 and 40 and the upper surface of the insulating layer 11.

Figure 11:
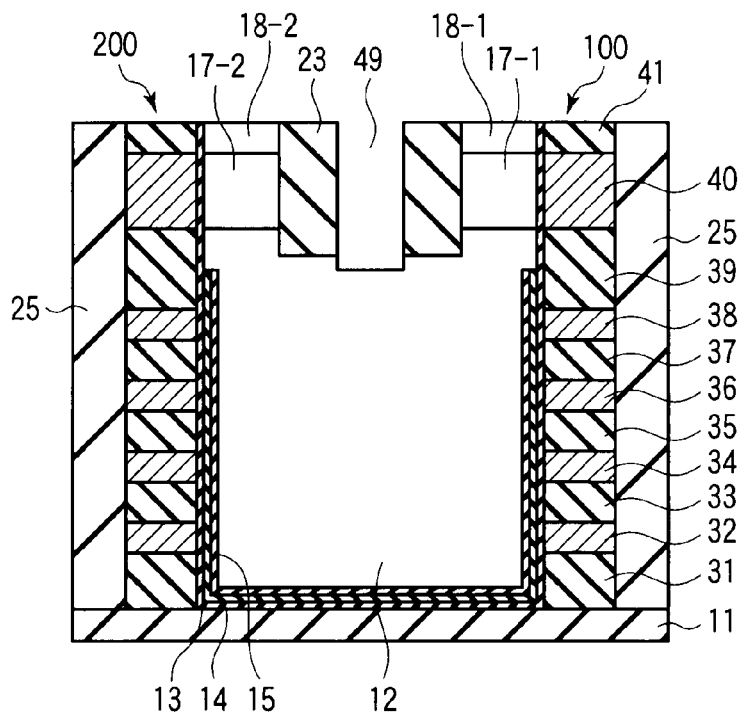
FIG. 11 is a cross-sectional view showing a manufacturing step of the NAND flash memory of the first embodiment.

Next, as shown in the cross-sectional view of FIG. 11, an opening portion 49 is formed to extend from the front surface side of the central portion of the insulating film 23 and reach semiconductor layer 12 by using the lithography method and RIE method.

Figure 12:
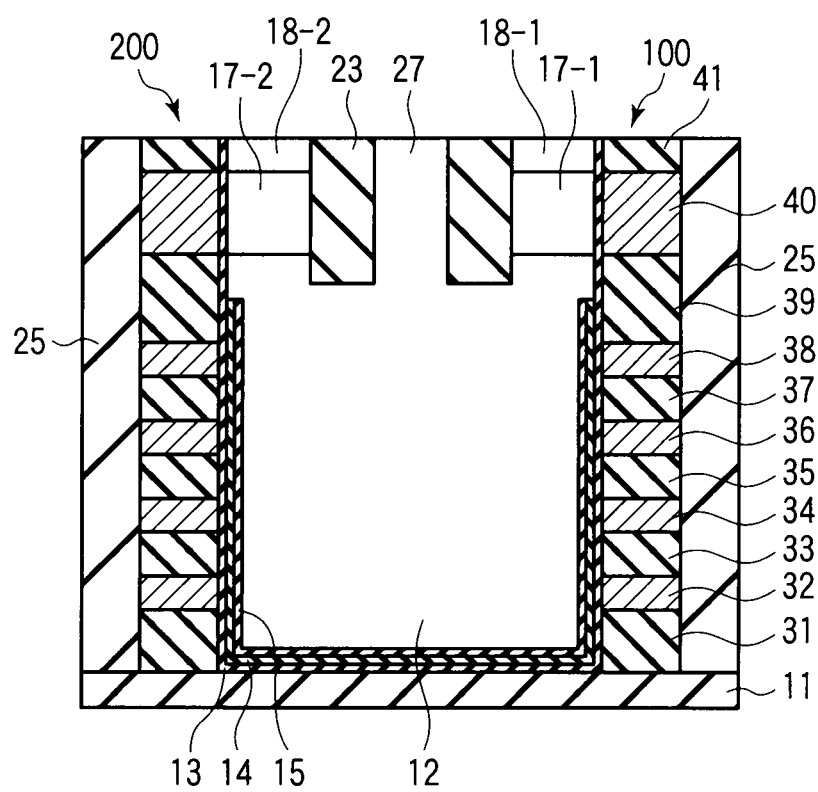
FIG. 12 is a cross-sectional view showing a manufacturing step of the NAND flash memory of the first embodiment.

Then, as shown in the cross-sectional view of FIG. 12, a silicon layer 27 (a silicon layer into which boron of p-type impurity is doped) that is the same as semiconductor layer 12 is filled and formed in opening portion 49. Further, an insulating film 25 that is a silicon oxide film or the like is filled and formed in opening portion 47.

After this, the NAND flash memory with the structure shown in FIG. 2 is obtained by forming a source line (SL) electrically connected to the source region (semiconductor layer 18-1) of select transistor SST and forming a bit line (BL) electrically connected to the drain region (semiconductor layer 18-2) of select transistor SDT.

Thus, according to this embodiment, since the memory cells MC and select transistors SST and SDT are formed vertically and stacked, the occupied area of the NAND flash memory can be reduced. In addition, since the silicon layer 27 is formed to penetrate the insulating layer 23 that isolates semiconductor layers 17-1 and 18-1 and semiconductor layers 17-2 and 18-2, substrate potential can be directly applied to p-type semiconductor layer 12 by means of the silicon layer 27. Therefore, a variation in voltages applied at the write time and erase time can be suppressed and stable write and erase operations can be performed.

(Second Embodiment)

Figure 13A:
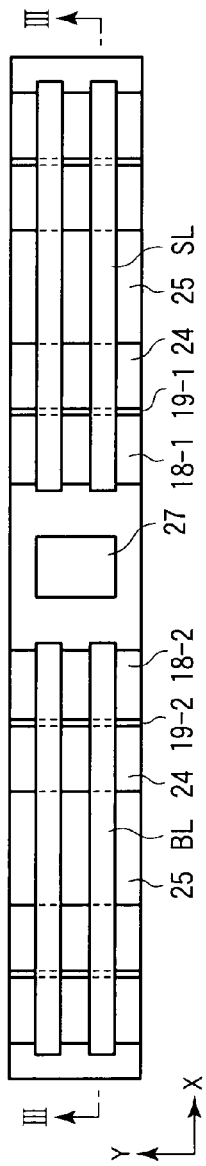
FIGS. 13A and 13B are plan and cross-sectional views showing the device structure of a NAND flash memory according to a second embodiment.
Figure 13B:
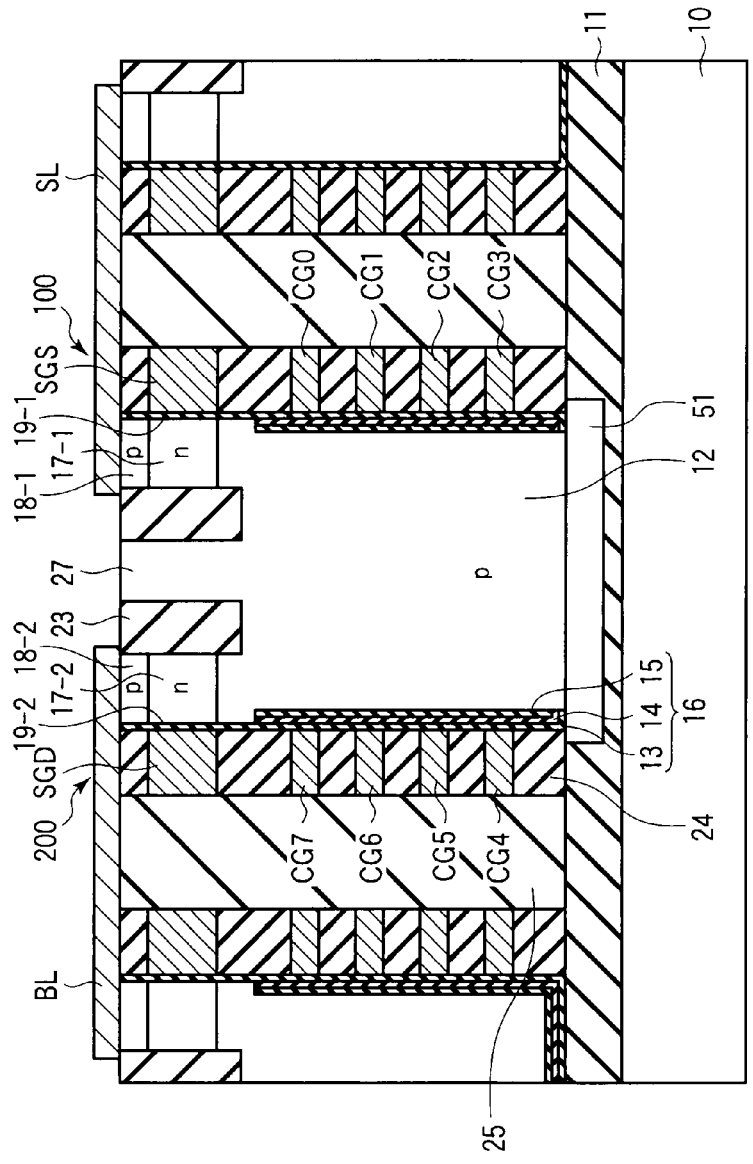

FIGS. 13A and 13B illustrate the device structure of a NAND flash memory according to a second embodiment of this invention, FIG. 13A being a plan view and FIG. 13B being a cross-sectional view taken along line of FIG. 13A. Portions that are the same as those of FIGS. 2A and 2B are denoted by the same reference symbols and the detailed explanation thereof is omitted.

This embodiment is different from the first embodiment described before in that a semiconductor layer that connects cell transistors between the first laminated body 100 and second laminated body 200 is formed on the surface portion of the insulating film 11. That is, an n-type semiconductor layer (fourth semiconductor layer) 51 is buried and formed in a portion of the insulating layer 11 that makes contact with semiconductor layer 12.

Next, the manufacturing method of the NAND flash memory of this embodiment is explained with reference to FIGS. 14 to 22.

Figure 14:
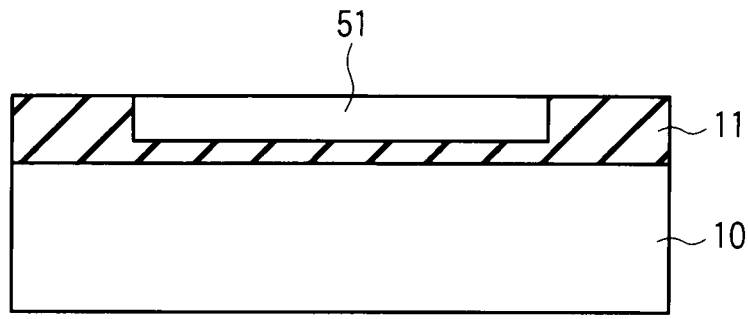
FIG. 14 is a cross-sectional view showing a manufacturing step of the NAND flash memory of the second embodiment.

First, as shown in the cross-sectional view of FIG. 14, a supporting substrate having an insulating layer 11 such as a silicon oxide film formed on a silicon substrate 10 is prepared and a groove portion is formed in the insulating layer 11 by the RIE method. Then, an n-type semiconductor layer 51 is formed by filling silicon having phosphorus of n-type impurity or the like added thereto in the groove portion. In this case, the size of the groove portion is set in a range that is slightly larger than a portion exposed by forming a groove portion 42 that will be described later.

Figure 15:
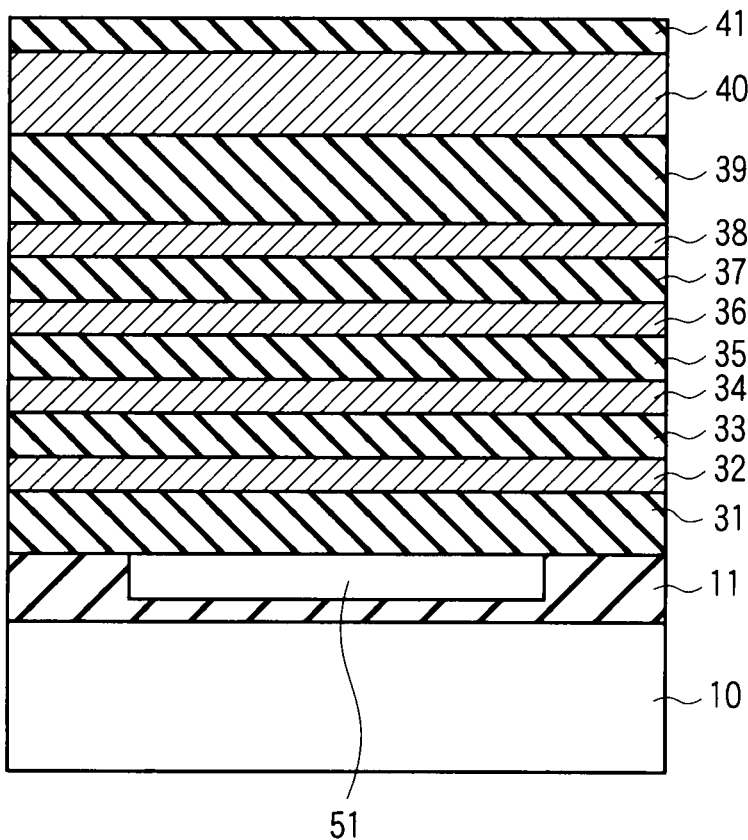
FIG. 15 is a cross-sectional view showing a manufacturing step of the NAND flash memory of the second embodiment.

Next, as shown in the cross-sectional view of FIG. 15, as in the first embodiment, a laminated body is formed on the insulating layer 11 having semiconductor layer 51 formed on the surface portion thereof by alternately laminating interlayer insulating films (31, 33, 35, 37, 39 and 41) and gate electrodes (32, 34, 36, 38 and 40).

Then, as shown in the cross-sectional view of FIG. 16, the interlayer insulating films (31, 33, 35, 37, 39 and 41) and gate electrodes (32, 34, 36, 38 and 40) are selectively etched by using the lithography method and RIE method and an opening portion 42 is formed in the laminated body to expose the upper surface of semiconductor layer 51 on the insulating layer 11. Thus, a first laminated body 100 and a second laminated body 200 are formed.

Figure 17:
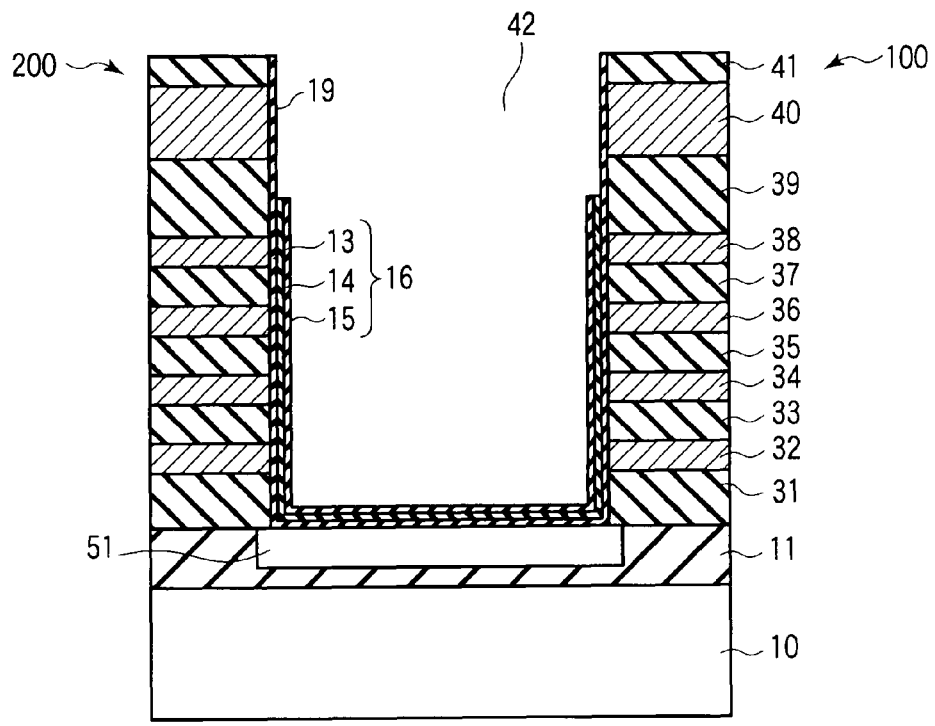
FIG. 17 is a cross-sectional view showing a manufacturing step of the NAND flash memory of the second embodiment.

Next, as shown in the cross-sectional view of FIG. 17, a gate insulating film portion 16 comprising a first gate insulating film 13, charge storage layer 14 and second gate insulating film 15 is formed on the side surfaces of the laminated bodies 100 and 200 exposed to opening portion 42 and on the bottom surface of opening portion 42. In this case, the first gate insulating film 13 is formed on the entire portion of opening portion 42 and the charge storage layer 14 and second gate insulating film 15 are formed to an intermediate portion of interlayer insulating film 39. A part of the first gate insulating film 13 is used as gate insulating film 19 of the select transistor.

Figure 18:
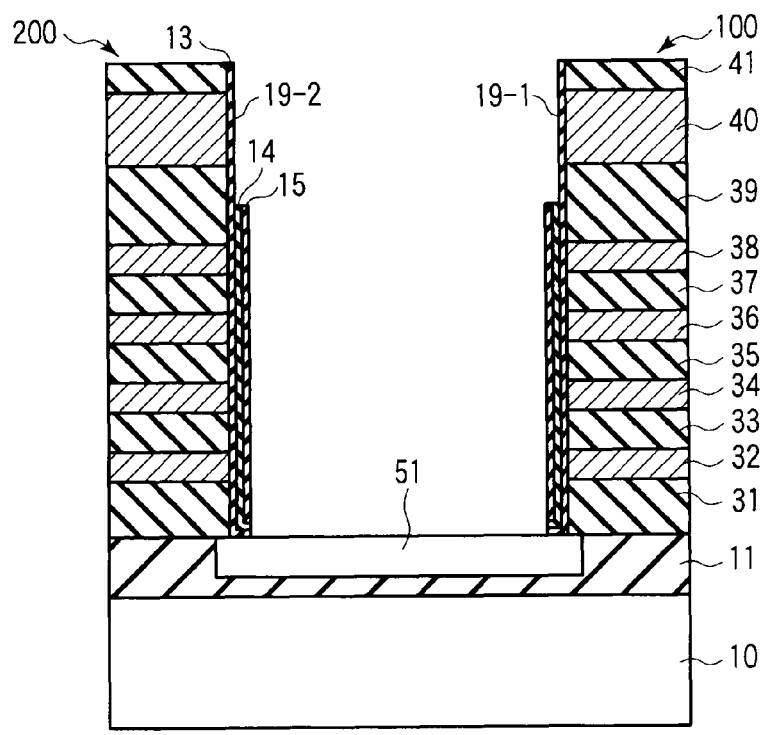
FIG. 18 is a cross-sectional view showing a manufacturing step of the NAND flash memory of the second embodiment.

Next, as shown in the cross-sectional view of FIG. 18, a portion of the gate insulating film portion 16 that is formed on the bottom portion of opening portion 42 is removed. In order to selectively remove the gate insulating film portion 16 formed on the groove bottom portion, the RIE method or the like is used and the etching process may be performed in a condition that the sidewall surface is difficult to be etched and the bottom portion is easily etched. Further, a mask may be formed on the sidewall surface of opening portion 42 and only a portion that is not covered with the mask may be etched.

Figure 19:
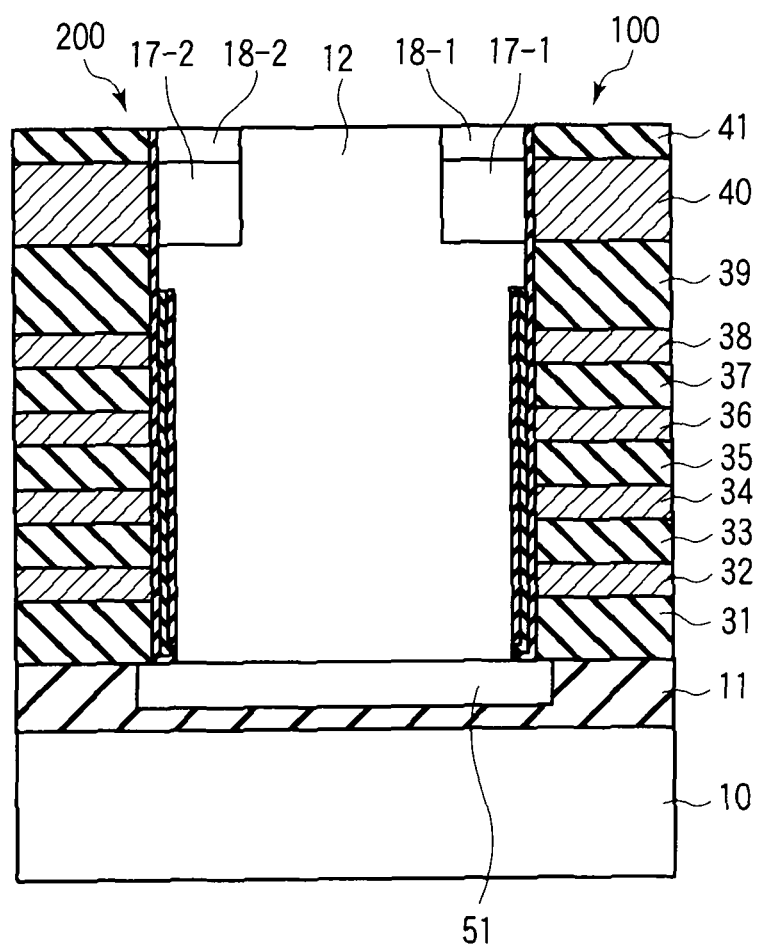
FIG. 19 is a cross-sectional view showing a manufacturing step of the NAND flash memory of the second embodiment.

Next, as shown in the cross-sectional view of FIG. 19, as in the first embodiment, after a p⁻-type semiconductor layer 12 is filled and formed in opening portion 42, n⁻-type semiconductor layers 17-1 and 17-2 acting as the channel regions of select transistors SST and SDT are formed by doping low-concentration n⁻-type impurities into semiconductor layer 12. Further, p⁺-type semiconductor layers 18-1 and 18-2 acting as the source regions of select transistors SST are formed by doping high-concentration p⁺-type impurities into semiconductor layers 17-1 and 17-2.

Figure 20A:
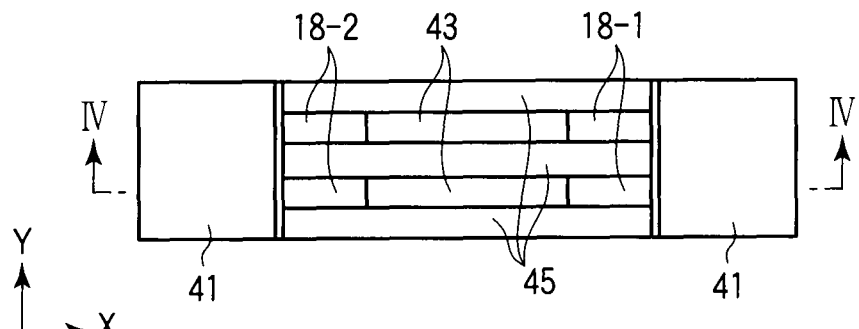
FIGS. 20A and 20B are plan and cross-sectional views showing a manufacturing step of the NAND flash memory of the second embodiment.
Figure 20B:
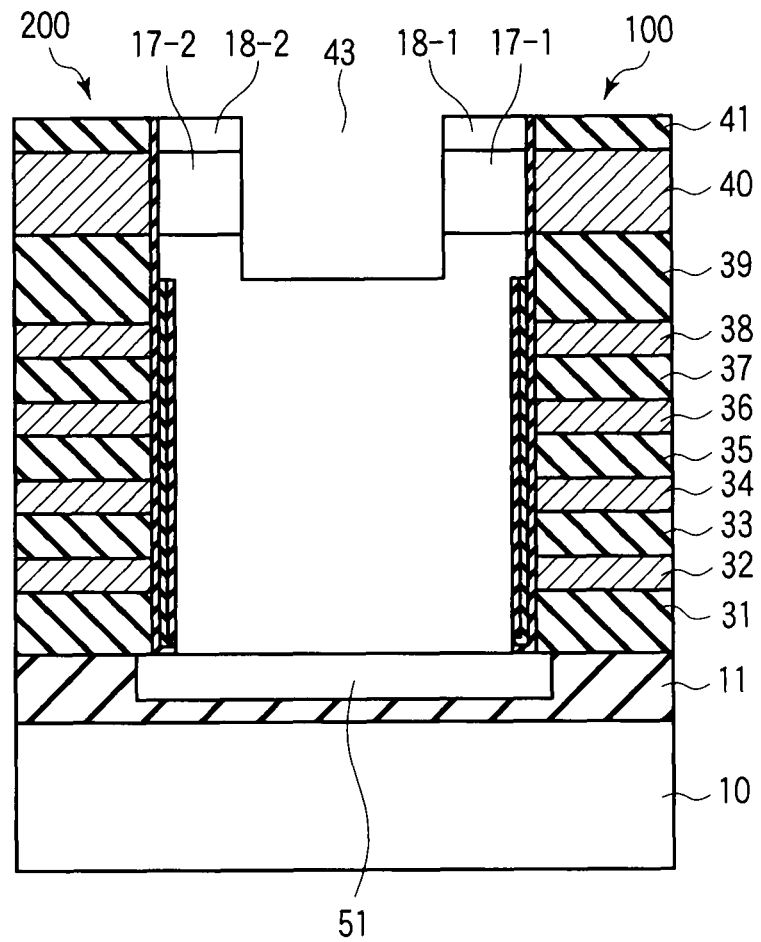

Then, as shown in the plan view of FIG. 20A and in the cross-sectional view of FIG. 20B taken along line IV-IV of FIG. 20A, opening portions 43 are formed to separate semiconductor layers 17-1 and 17-2 and p-type semiconductor layers 18-1 and 18-2 into right and left portions by using the lithography method and RIE method. Further, opening portions 45 are formed to separate a plurality of units.

Next, as shown in the cross-sectional view of FIG. 21, the units that are adjacent in the Y direction are electrically isolated and semiconductor layers 17-1 and 18-1 and semiconductor layers 17-2 and 18-2 are isolated by filling insulating films 23 into opening portions 43 and 45. Subsequently, interlayer insulating films 31, 33, 35, 37, 39 and 41 and gate electrodes 32, 34, 36, 38 and 40 are patterned in order to electrically isolate the gate electrodes of the blocks adjacent in the X direction. As a result, opening portions 47 are formed to expose the side surfaces of gate electrodes 32, 34, 36, 38 and 40 and the upper surface of the insulating layer 11.

Figure 22:
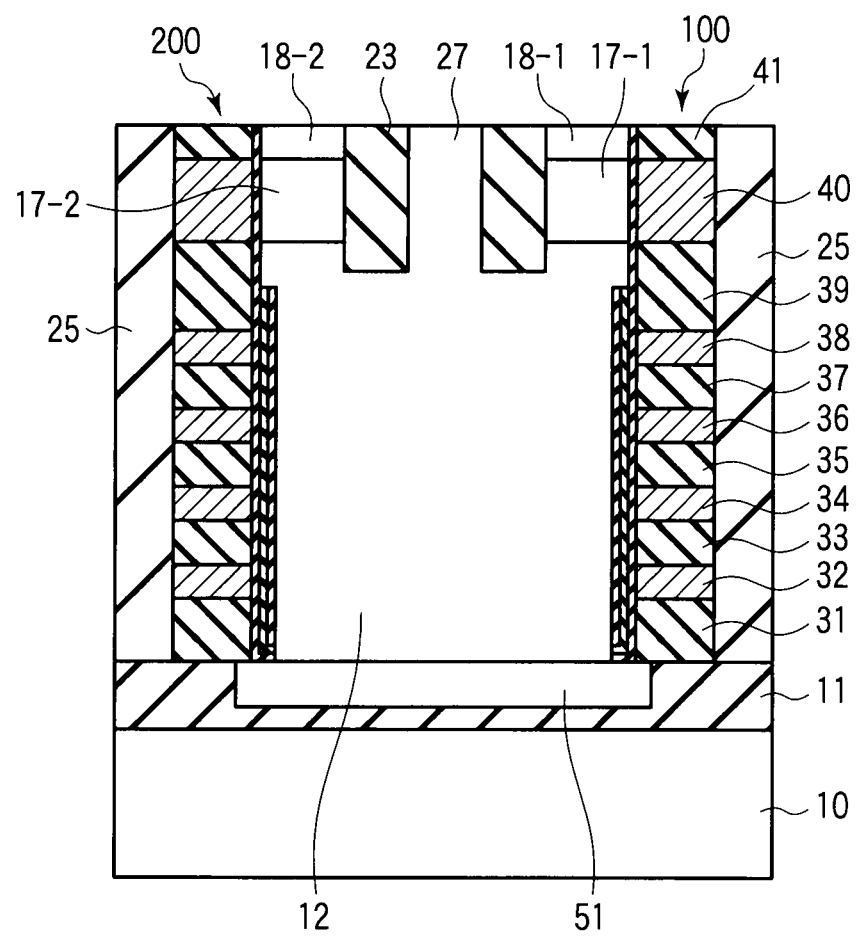
FIG. 22 is a cross-sectional view showing a manufacturing step of the NAND flash memory of the second embodiment.

Next, as shown in the cross-sectional view of FIG. 22, after an opening portion is formed to extend from the front surface side of the central portion of the insulating film 23 and reach semiconductor layer 12 by using the lithography method and RIE method, a silicon layer 27 that is the same as semiconductor layer 12 is filled and formed in the opening portion. Further, an insulating film 25 that is a silicon oxide film or the like is filled and formed in opening portion 47.

After this, the NAND flash memory with the structure shown in FIG. 13 is obtained by forming a source line (SL) electrically connected to the source region (semiconductor layer 18-1) of select transistor SST and forming a bit line (BL) electrically connected to the drain region (semiconductor layer 18-2) of select transistor SDT.

Thus, according to this embodiment, as in the first embodiment, the area of the NAND flash memory can be reduced. At the same time, it is of course possible to perform the stable write and erase operations and the following effect can be attained. That is, since semiconductor layer 51 extending over the right and left laminated bodies 100 and 200 is formed on the bottom portion of semiconductor layer 12, a current can easily flow from the source line side to the drain line side. Specifically, the memory cells having gate electrodes 32 (CG3 and CG4) can be properly connected by means of semiconductor layer 51. Therefore, the resistance between the cell transistors (MC3 and MC4) can be reduced and the device characteristic can be enhanced.

(Third Embodiment)

Figure 24:
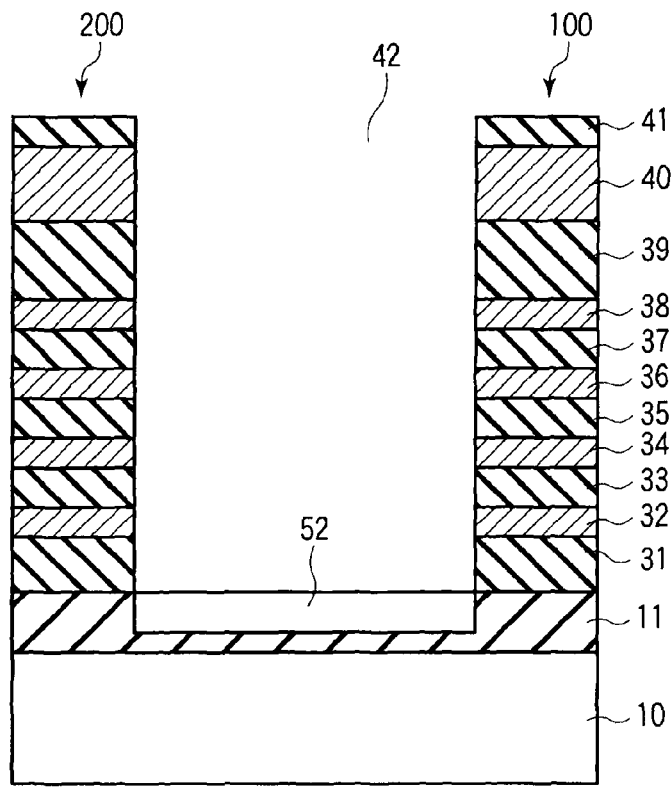
FIG. 24 is a cross-sectional view showing a manufacturing step of the NAND flash memory of the third embodiment.

FIGS. 23 and 24 are cross-sectional views showing manufacturing steps of a NAND flash memory according to a third embodiment of this invention. Portions that are the same as those of FIG. 13B are denoted by the same reference symbols and the detailed explanation thereof is omitted.

This embodiment is different from the second embodiment described before in the forming sequence of a semiconductor layer that connects cell transistors (MC3 and MC4).

In this embodiment, as in the first embodiment (FIGS. 3 and 4), first, a laminated body is formed on an insulating layer 11 by alternately laminating interlayer insulating films (31, 33, 35, 37, 39 and 41) and gate electrodes (32, 34, 36, 38 and 40). Then, a first laminated body 100 and second laminated body 200 are formed by forming an opening portion 42 in the laminated body by using the lithography method and RIE method.

Next, as shown in FIG. 23, a portion of the insulating film 11 that is exposed to opening portion 42 is etched by using the RIE method or the like to form a groove portion 46.

Then, as shown in FIG. 24, an n-type semiconductor layer (fourth semiconductor layer) 52 is formed by filling silicon having phosphorus of n-type impurity or the like doped therein in the groove portion 46.

After this, as in the first and second embodiments, a NAND flash memory is completed by forming a gate insulating film portion 16, semiconductor layers 12, 17 and 18, insulating layer 23 and semiconductor layer 27.

Thus, according to this embodiment, since semiconductor layer 52 that extends over the right and left laminated bodies 100 and 200 is formed on the bottom portion of semiconductor layer 12, the same effect as that of the second embodiment can be attained. Further, since semiconductor layer 52 can be formed in a self-aligned fashion, the manufacturing process can be simplified.

(Modification)

This invention is not limited to the above embodiments and can be variously modified and embodied without departing from the scope thereof. In the above embodiments, p-type semiconductor layer 12 is formed to fill the entire portion of the groove between the first and second laminated bodies 100 and 200 and n-type semiconductor layer 17 and p-type semiconductor layer 18 are formed by, for example, diffusing impurities into p-type semiconductor layer 12. However, the semiconductor layer forming method is not limited to this method. For example, after a p-type semiconductor layer 12 is filled to reach a portion that lies on the bottom portion of gate electrode 40 of the select transistor, an n-type semiconductor layer 17 may be grown on semiconductor layer 12 to reach a portion that lies on the top portion of the gate electrode of each select transistor and a p-type semiconductor layer 18 may be grown on semiconductor layer 17.

Further, in the above embodiments, a case wherein the memory cells and select transistors are configured by the nMOS transistors is explained, but pMOS transistors can be used by inverting pn of the respective semiconductor layers. Further, it is not always necessary to form the gate electrode of the select transistor integrally with the memory cell and the gate electrode may be separately formed on the laminated body that configures the memory cell.

Further, various inventions can be made by adequately combining a plurality of constituents disclosed in the embodiments. For example, several constituents may be eliminated from all of the constituents disclosed in the embodiments and constituents of the different embodiments may be properly combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   first laminated bodies each having a plurality of first gate electrodes laminated with insulating films disposed therebetween to form a plurality of first memory cells on a substrate,
   second laminated bodies located separately from the first laminated bodies on the substrate and each having a plurality of second gate electrodes laminated with insulating films disposed therebetween to form a plurality of second memory cells,
   gate insulating film portions located on side surfaces of the first laminated bodies and the second laminated bodies and each containing a charge storage layer,
   first semiconductor layers that are each located between the first laminated bodies and the second laminated bodies on which the gate insulating film portion is formed and act as active regions of the first memory cells and the second memory cells,
   first select transistors located above the first semiconductor layers and each serially connected to an uppermost one of the first memory cells,
   second select transistors located above the first semiconductor layers and each serially connected to an uppermost one of the second memory cells,
   isolation insulating films located on the first semiconductor layers to separate the first select transistors and the second select transistors into portions on the first laminated body sides and the second laminated body sides, and
   a substrate potential applying electrode located to penetrate the isolation insulating films from a front surface side to a back surface side and connected to the first semiconductor layers.

2. The device according to claim 1, wherein second semiconductor layers with a different conductivity type from that of the first semiconductor layers are each located on a bottom portion of the first semiconductor layer to continuously extend from the first laminated body side to the second laminated body side.

3. The device according to claim 1, wherein the substrate comprises an insulating film on a semiconductor substrate.

4. The device according to claim 1, wherein the substrate comprises a semiconductor substrate, an insulating film on the semiconductor substrate, and a second semiconductor layer having a different conductivity type from the first semiconductor layer and buried in the insulating film on the semiconductor substrate.

5. The device according to claim 1, wherein the gate insulating film portion comprises first gate insulating films located on side surfaces of the first laminated bodies and the second laminated bodies, charge storage layers located on side surfaces of the first gate insulating films and second gate insulating films located on side surfaces of the charge storage layers.

6. The device according to claim 1, wherein a groove is formed in the first semiconductor layer in a facing direction of the first laminated bodies and the second laminated bodies and the first semiconductor layer is separated in a plurality of plate-like bodies.

7. A nonvolatile semiconductor memory device comprising:
   first laminated bodies each having a plurality of first gate electrodes laminated with insulating films disposed therebetween to form a plurality of first memory cells on a substrate and having a gate electrode of a first select transistor laminated above an uppermost one of the first gate electrodes with an insulating film disposed therebetween,
   second laminated bodies located separately from the first laminated bodies on the substrate and each having a plurality of second gate electrodes laminated with insulating films disposed therebetween to form a plurality of second memory cells and having a gate electrode of a second select transistor laminated above an uppermost one of the second gate electrodes with an insulating film disposed therebetween,
   gate insulating film portions located on side surfaces of the first laminated bodies and the second laminated bodies and each containing a charge storage layer,
   first semiconductor layers of a first conductivity type that are each located between the first laminated bodies and the second laminated bodies to a portion lying on bottom portions of the gate electrodes of the respective select transistors in a laminated direction and act as active regions of the first memory cells and the second memory cells, the first semiconductor layers being in contact with the gate insulating film portions,
   second semiconductor layers of a second conductivity type located on the first semiconductor layers to portions that lie on top portions of the gate electrodes of the respective select transistors in a laminated direction,
   third semiconductor layers of the first conductivity type located on the second semiconductor layers,
   isolation insulating films located in the second and third semiconductor layers to separate the second and third semiconductor layers into portions on the first laminated body sides and the second laminated body sides, and a substrate potential applying electrode located to penetrate the isolation insulating films from a front surface side to a back surface side thereof and connected to the first semiconductor layers.

8. The device according to claim 7, wherein the gate insulating film portion comprises first gate insulating films located on portions corresponding to the first gate electrodes and the second gate electrodes on the side surfaces of the first laminated bodies and the second laminated bodies, charge storage layers located on side surfaces of the first gate insulating films, second gate insulating films located on side surfaces of the charge storage layers, and gate insulating films for the select transistors formed on portions corresponding to the gate electrodes of the first select transistors and the second select transistors on the side surfaces of the first laminated bodies and the second laminated bodies.

9. The device according to claim 8, wherein the first gate insulating film is continuously formed from an upper surface of the substrate to upper portions of the first laminated bodies and the second laminated bodies, the charge storage layer and second gate insulating film are continuously formed from the upper surface of the substrate to a portion between the gate electrode of the select transistor and uppermost layers of the first gate electrodes and the second gate electrodes, and the gate insulating film for the select transistor is formed of the first gate insulating film.

10. The device according to claim 8, wherein the first gate insulating film and the charge storage layer are continuously formed from the upper surface of the substrate to a portion between the gate electrode of the select transistor and uppermost layers of the first gate electrodes and the second gate electrodes, the second gate insulating film is continuously formed from the upper surface of the substrate to upper portions of the first laminated bodies and the second laminated bodies, and the gate insulating film for the select transistor is formed of the second gate insulating film.

11. The device according to claim 7, wherein the substrate comprises an insulating film on a semiconductor substrate.

12. The device according to claim 7, wherein the substrate comprises a semiconductor substrate, an insulating film on the semiconductor substrate, and a fourth semiconductor layer having a second conductivity type that makes contact with the bottom portion of the first semiconductor layer and buried in the insulating film on the semiconductor substrate.

13. The device according to claim 7, wherein a groove is formed in the first to third semiconductor layers in a facing direction of the first laminated bodies and the second laminated bodies and the first to third semiconductor layers are separated in a plurality of plate-like bodies.

14. The device according to claim 7, wherein the first select transistors and the second select transistors are enhancement metal insulator semiconductor (MIS) transistors and the first memory cells and the second memory cells are depletion MIS transistors.

* * * * *

UNITED STATES PATENT AND TRADEMARK OFFICE
CERTIFICATE OF CORRECTION

| | | |
|---|---|---|
| PATENT NO. | : 8,581,326 B2 | Page 1 of 1 |
| APPLICATION NO. | : 12/727644 | |
| DATED | : November 12, 2013 | |
| INVENTOR(S) | : Shigeto Oota et al. | |

It is certified that error appears in the above-identified patent and that said Letters Patent is hereby corrected as shown below:

On the title page, Item (30), the Foreign Application Priority Data has been omitted. Item (30) should read:

--(30)     Foreign Application Priority Data

May 28, 2009     (JP)..........................2009-129265--

Signed and Sealed this
Eleventh Day of February, 2014

Michelle K. Lee
*Deputy Director of the United States Patent and Trademark Office*